US008502959B2

(12) United States Patent
Hirano (10) Patent No.: US 8,502,959 B2
(45) Date of Patent: Aug. 6, 2013

(54) EXPOSURE APPARATUS AND DEVICE FABRICATION METHOD (75) Inventor: Shinichi Hirano, Utsunomiya (JP)

(73) Assignee: Canon Kabushiki Kaisha (JP)

(*) Notice: Subject to any disclaimer, the term of this patent is extended or adjusted under 35 U.S.C. 154(b) by 468 days.

(21) Appl. No.: 12/832,671

(22) Filed: Jul. 8, 2010

(65) Prior Publication Data
US 2011/0007296 A1 Jan. 13, 2011

(30) Foreign Application Priority Data

Jul. 9, 2009 (JP) ................................. 2009-163007
Jun. 18, 2010 (JP) ................................. 2010-139950

(51) Int. Cl.
G03B 27/58 (2006.01)
G03B 27/52 (2006.01)
G03B 27/60 (2006.01)
G03B 27/32 (2006.01)
G03B 27/42 (2006.01)

(52) U.S. Cl.
USPC .................. 355/72; 355/30; 355/53; 355/73; 355/77

(58) Field of Classification Search
USPC ................ 355/30, 53, 72–75, 77; 250/492.1, 250/492.2, 492.22, 493.1, 548; 430/5, 8, 430/22, 30, 311, 312
See application file for complete search history.

(56) References Cited

U.S. PATENT DOCUMENTS

| 5,636,964 | A | * | 6/1997 | Somekh et al. | 414/806 |
| 5,655,060 | A | * | 8/1997 | Lucas | 700/250 |
| 5,936,710 | A | * | 8/1999 | Itoh et al. | 355/53 |
| 6,318,957 | B1 | * | 11/2001 | Carr et al. | 414/810 |
| 6,404,483 | B1 | * | 6/2002 | Segers et al. | 355/53 |
| 6,590,633 | B1 | * | 7/2003 | Nishi et al. | 355/53 |
| 7,692,763 | B2 | | 4/2010 | Kihara et al. | |
| 2001/0047225 | A1 | * | 11/2001 | Shimoike et al. | 700/250 |
| 2002/0089655 | A1 | * | 7/2002 | Kida et al. | 355/72 |
| 2003/0127605 | A1 | * | 7/2003 | Kondo | 250/492.2 |
| 2004/0075822 | A1 | * | 4/2004 | Hattori | 355/72 |
| 2004/0080734 | A1 | * | 4/2004 | Taniguchi et al. | 355/53 |
| 2004/0185662 | A1 | * | 9/2004 | Fujisawa et al. | 438/689 |
| 2005/0135903 | A1 | * | 6/2005 | Rice et al. | 414/217 |
| 2008/0285203 | A1 | * | 11/2008 | Weijiang et al. | 361/234 |

FOREIGN PATENT DOCUMENTS

JP 2006269867 A 10/2006

* cited by examiner

Primary Examiner — Toan Ton
Assistant Examiner — Christina Riddle
(74) Attorney, Agent, or Firm — Rossi, Kimms & McDowell LLP (57) ABSTRACT The present invention provides an exposure apparatus which transfers a pattern of a reticle onto a substrate, the apparatus including a convey unit configured to convey the substrate while chucking and holding a lower surface of the substrate, and a control unit configured to control a conveyance condition of the convey unit so that a conveyance acceleration is lower when the convey unit conveys the substrate in a vertical direction with downward acceleration than when the convey unit conveys the substrate in the vertical direction with upward acceleration.

15 Claims, 6 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

The performance of an exposure apparatus for use in a semiconductor device fabrication process is mainly evaluated based on three points: resolution, overlay accuracy, and throughput. Note that the resolution means the minimum feature size of a pattern that can be precisely transferred, the overlay accuracy means the accuracy of overlaying several patterns, and the throughput is the production capacity (the number of processed wafers) per unit time. Among these three points, several techniques for improving the throughput have conventionally been examined. Examples of these techniques are to increase the exposure energy per unit time, to shorten the time taken for a wafer stage to move between shots, and to shorten the wafer conveyance time (exchange time) taken for wafer exchange.

To shorten the wafer conveyance time, it is necessary to control the wafer state. The wafer often suffers warping or strain due to the dynamic influence of the shape of the transferred pattern or a coating film on it. Such warping or strain of the wafer generates a chucking error upon chucking and conveying the wafer, leading to a shift or drop of the wafer during its conveyance. Under the circumstance, Japanese Patent Laid-Open No. 2006-269867 proposes a technique to change the control conditions of processes associated with exposure, in accordance with warping or strain of the wafer.

Unfortunately, the conventional techniques do not take account of a method of changing the control conditions of processes associated with exposure, in accordance with the wafer conveyance direction, so the throughput may decrease if these techniques are exploited without considering this aspect.

SUMMARY OF THE INVENTION

The present invention provides a technique advantageous to prevent a substrate from shifting and dropping and to improve the throughput of an exposure apparatus.

According to one aspect of the present invention, there is provided an exposure apparatus which transfers a pattern of a reticle onto a substrate, the apparatus comprising: a convey unit configured to convey the substrate while chucking and holding a lower surface of the substrate; and a control unit configured to control a conveyance condition of the convey unit so that a conveyance acceleration is lower when the convey unit conveys the substrate in a vertical direction with downward acceleration than when the convey unit conveys the substrate in the vertical direction with upward acceleration.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
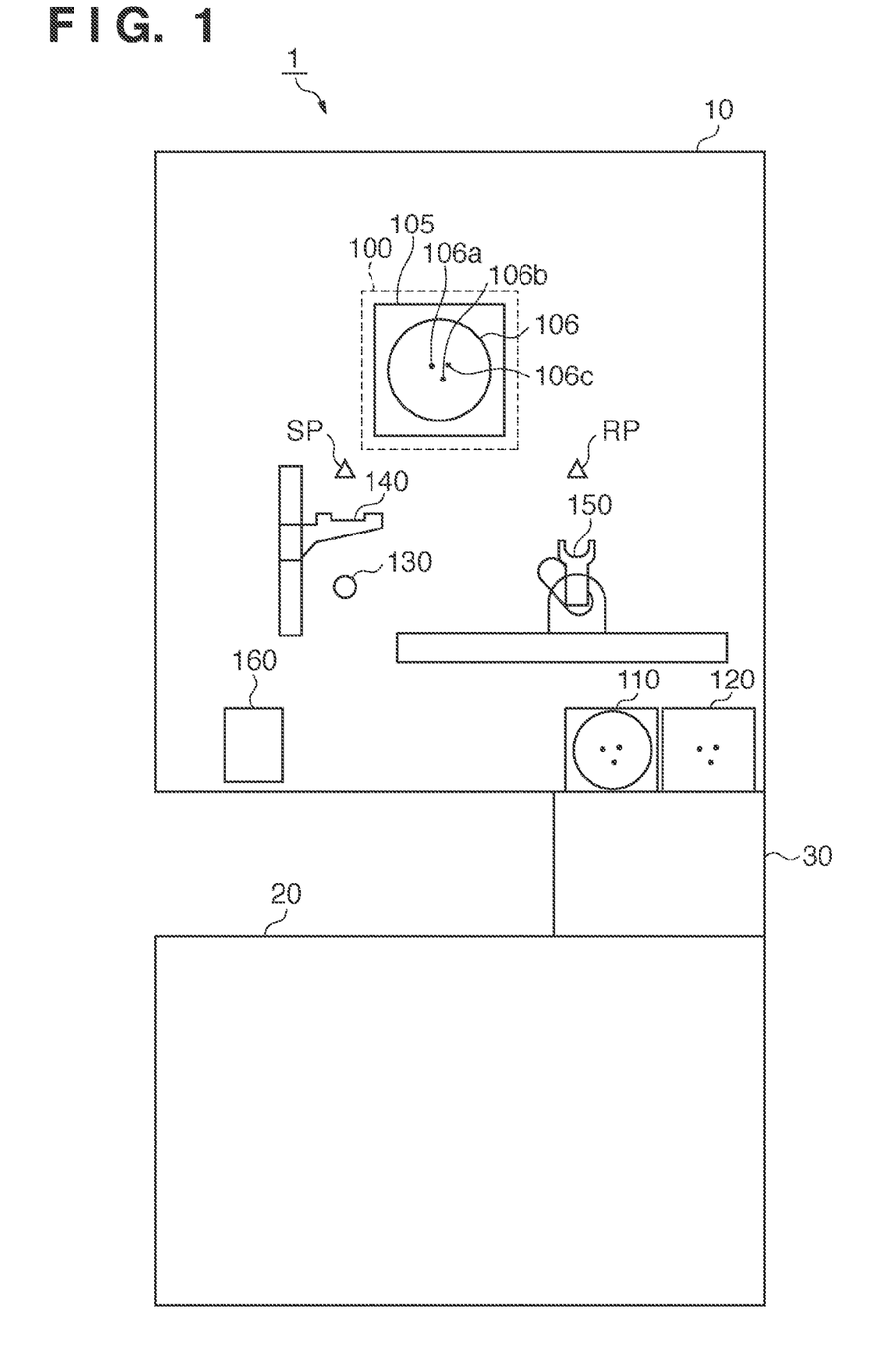
FIG. 1 is a schematic view showing the arrangement of an exposure system including an exposure apparatus according to one aspect of the present invention.

FIG. 1 is a schematic view showing the arrangement of an exposure system 1 including an exposure apparatus 10 according to one aspect of the present invention. The exposure system 1 includes the exposure apparatus 10 and external apparatus such as a coating/developing apparatus 20 and transfer apparatus 30, as shown in FIG. 1. The coating/developing apparatus 20 has a function of coating a wafer to be exposed (a wafer before an exposure process) with a photoresist (photosensitive agent), and a function of developing an exposed wafer (a wafer after an exposure process). The transfer apparatus 30 has a function of connecting the exposure apparatus 10 and the coating/developing apparatus 20 to each other to exchange wafers between them. Note that the transfer apparatus 30 is often called an EFEM (Equipment Front End Module).

The exposure apparatus 10 is accommodated in a chamber for maintaining the exposure environment (for example, temperature, humidity, and pressure) constant. In this embodiment, the exposure apparatus 10 is a projection exposure apparatus which transfers the pattern of a reticle onto a wafer (substrate) by the step & scan scheme. However, the exposure apparatus 10 can also adopt the step & repeat scheme or another exposure scheme.

The exposure apparatus 10 includes an exposure process unit 100, loading station 110, unloading station 120, alignment unit 130, feed hand 140, convey hand 150, and control unit 160, as shown in FIG. 1.

Figure 2:
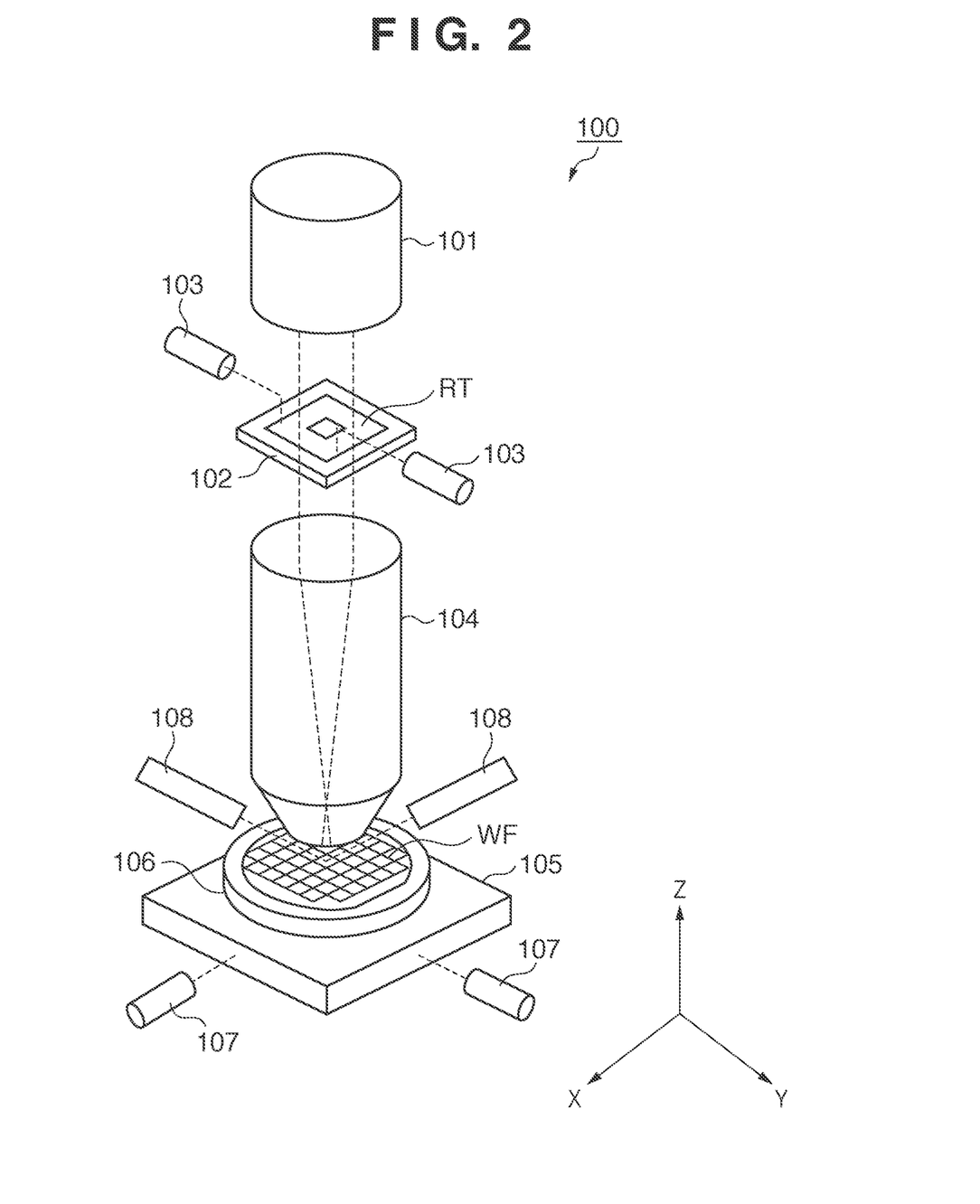
FIG. 2 is a schematic view showing the arrangement of an exposure process unit of the exposure apparatus in the exposure system shown in FIG. 1.

The exposure process unit 100 includes an illumination optical system 101, reticle stage 102, reticle measurement system 103, projection optical system 104, wafer stage 105, wafer chuck 106, laser interferometer 107, and focus measurement system 108, as shown in FIG. 2. The illumination optical system 101 illuminates a reticle RT with light from a light source. The reticle stage 102 holds and drives the reticle RT on which a circuit pattern is formed. The reticle measurement system 103 measures the position of the reticle RT held by the reticle stage 102. The projection optical system 104 projects the circuit pattern of the reticle RT onto a wafer WF. The wafer stage 105 holds and drives the wafer WF in the X-, Y-, and Z-axis directions and rotation directions about the respective axes. The wafer chuck 106 is mounted on the wafer stage 105, and chucks and holds the wafer WF. The laser interferometer 107 measures the position of the wafer stage 105. The focus measurement system 108 measures the focus position of the wafer WF (its position in the Z-axis direction). In an exposure process, light from the illumination optical system 101 illuminates the reticle RT. The light which bears the information of the pattern of the reticle RT forms an image on the wafer WF via the projection optical system 104.

Referring back to FIG. 1, three pins 106a, 106b, and 106c which ascend/descend in order to exchange the wafer WF with the feed hand 140 and convey hand 150 are inserted in the wafer chuck 106 which chucks and holds the wafer WF.

A wafer to be exposed is stored (placed) in the loading station 110. An exposed wafer is stored (placed) in the unloading station 120. The alignment unit 130 aligns the wafer WF.

The feed hand 140 conveys the wafer WF aligned by the alignment unit 130 from the alignment unit 130 to a supply position SP, and transfers the wafer WF to the wafer chuck 106 at the supply position SP. The convey hand 150 conveys the wafer WF stored in the loading station 110 to the alignment unit 130. Also, the convey hand 150 receives the wafer WF, held by the wafer chuck 106, at a recovery position RP, and conveys the wafer WF from the recovery position RP to the unloading station 120. In this embodiment, the feed hand 140 and convey hand 150 function as a convey unit which conveys the wafer WF while chucking and holding the lower surface of the wafer WF. Note that in FIG. 1, the supply position SP and recovery position RP are specific positions on the plane where the wafer stage 105 is movable.

Conveyance of the wafer WF by the feed hand 140 and, more specifically, transfer of the wafer WF to the wafer chuck 106, and conveyance of the wafer WF by the convey hand 150 and, more specifically, reception of the wafer WF from the wafer chuck 106 will be explained herein.

FIGS. 3A to 3E are views showing in time sequence processes of transferring the wafer WF to the wafer chuck 106 by the feed hand 140. To transfer the wafer WF to the wafer chuck 106, first, the three pins 106a, 106b, and 106c inserted in the wafer chuck 106 start to ascend (see FIG. 3A).

Figure 3A:
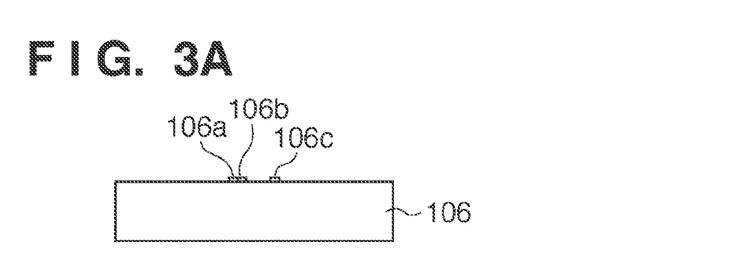
FIGS. 3A to 3E are views showing in time sequence processes of transferring a wafer to a wafer chuck by a feed hand of the exposure apparatus in the exposure system shown in FIG. 1.
Figure 3B:
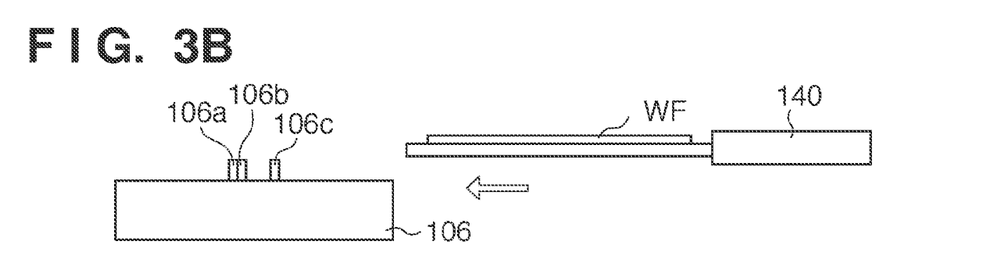

After the pins 106a to 106c complete their ascent, the feed hand 140 starts to be driven in the horizontal direction (a direction indicated by a left arrow) (see FIG. 3B). That is, the feed hand 140 conveys a wafer WF to be exposed in the horizontal direction until it is positioned on the pins 106a to 106c while chucking and holding the lower surface of the wafer WF.

Figure 3C:
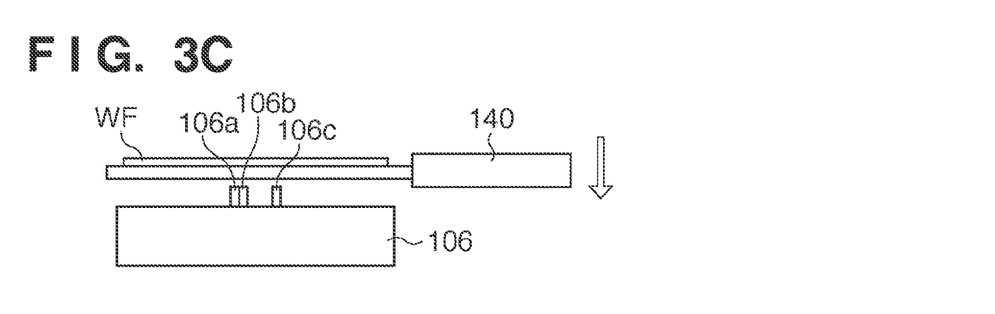

After the wafer WF is positioned on the pins 106a to 106c, the feed hand 140 stops its movement in the horizontal direction, cancels the chucking of the lower surface of the wafer WF, and starts to be driven downward in the vertical direction (see FIG. 3C). That is, the feed hand 140 starts to convey the wafer WF downward in the vertical direction (a direction indicated by a down arrow) in order to transfer the wafer WF to the pins 106a to 106c.

Figure 3D:
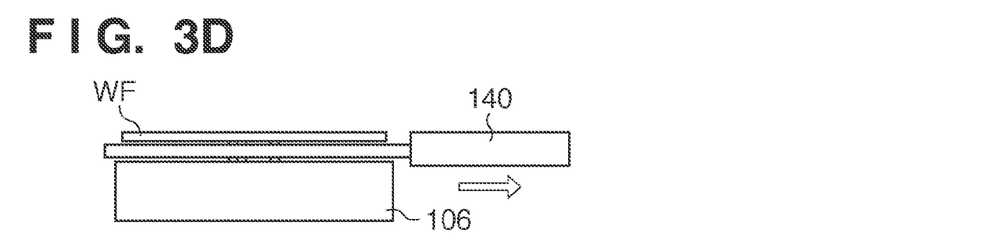

After the feed hand 140 transfers the wafer WF to the pins 106a to 106c (when the wafer WF has been held by the pins 106a to 106c), the feed hand 140 stops its movement downward in the vertical direction, and starts to be driven in the horizontal direction (a direction indicated by a right arrow) (see FIG. 3D).

Figure 3E:
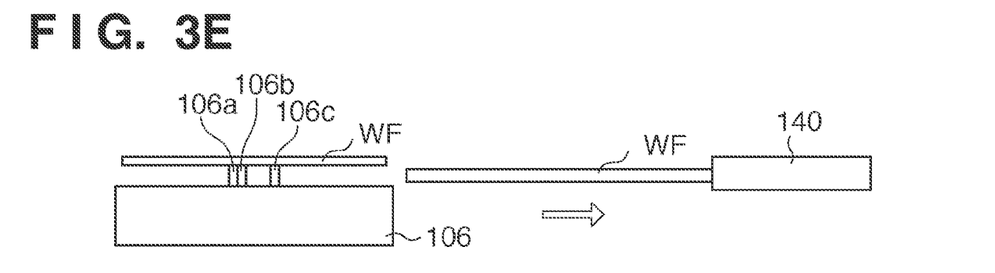

After the feed hand 140 retreats from the space between the wafer WF and the wafer chuck 106, the pins 106a, 106b, and 106c start to descend (see FIG. 3E). In this way, the wafer WF is transferred from the feed hand 140 to the wafer chuck 106, and is chucked and held by the wafer chuck 106.

FIGS. 4A to 4E are views showing in time sequence processes of receiving the wafer WF from the wafer chuck 106 by the convey hand 150. To receive the wafer WF from the wafer chuck 106, first, the wafer chuck 106 cancels the chucking of the exposed wafer WF. The three pins 106a, 106b, and 106c inserted in the wafer chuck 106 start to ascend (see FIG. 4A).

Figure 4A:
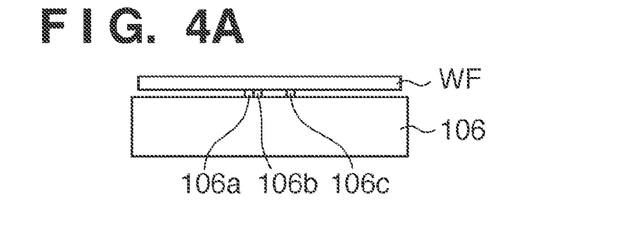
FIGS. 4A to 4E are views showing in time sequence processes of receiving the wafer from the wafer chuck by a convey hand of the exposure apparatus in the exposure system shown in FIG. 1.
Figure 4B:
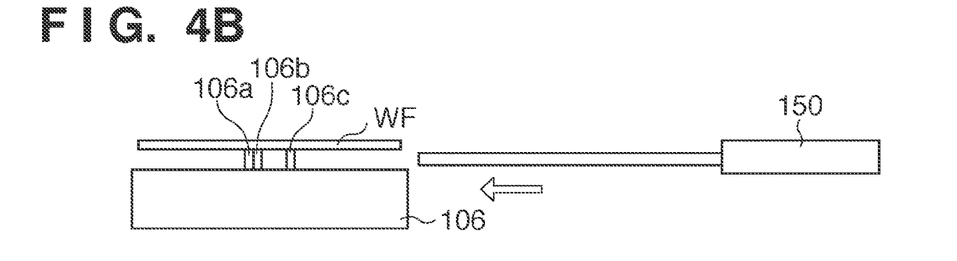

After the pins 106a to 106c complete their ascent, the convey hand 150 starts to be driven in the horizontal direction (a direction indicated by a left arrow) (see FIG. 4B). That is, the convey hand 150 is driven in the horizontal direction up to the position, where the wafer WF is received, between the wafer WF and the wafer chuck 106.

Figure 4C:
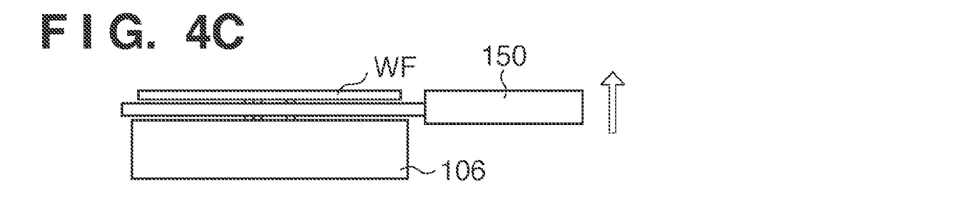

After the convey hand 150 is positioned between the wafer WF and the wafer chuck 106, it stops its movement in the horizontal direction, and starts to be driven upward in the vertical direction (a direction indicated by an up arrow) in order to receive the wafer WF from the pins 106a to 106c (see FIG. 4C).

Figure 4D:
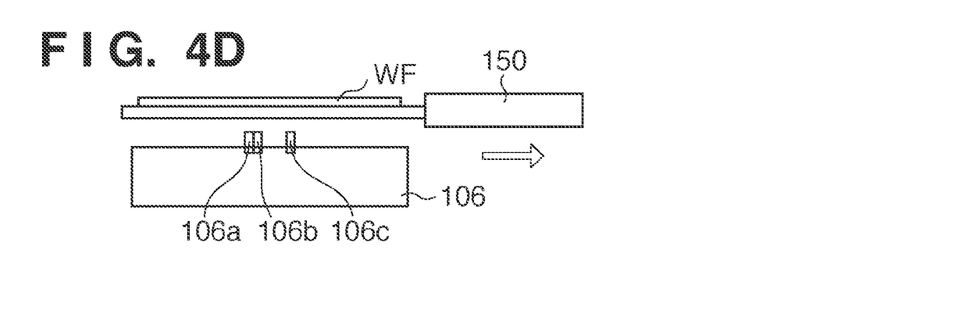

After the convey hand 150 receives the wafer WF from the pins 106a to 106c (when the wafer WF has been held by the convey hand 150), it stops its movement upward in the vertical direction, chucks the lower surface of the wafer WF, and starts to be driven in the horizontal direction (see FIG. 4D). That is, the convey hand 150 conveys the exposed wafer WF in the horizontal direction while chucking and holding the lower surface of the wafer WF.

Figure 4E:
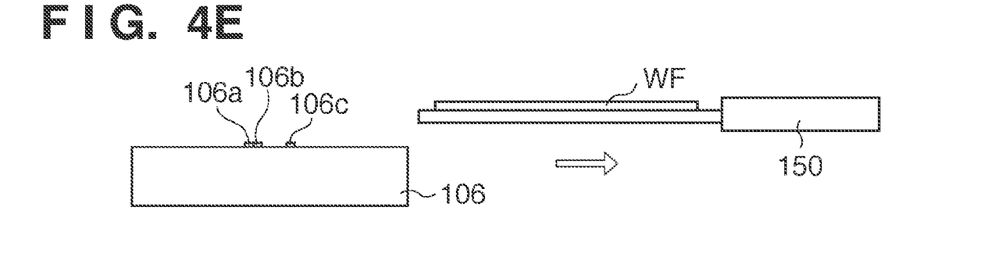

After the convey hand 150 retreats from the space between the wafer WF and the wafer chuck 106, the pins 106a, 106b, and 106c start to descend (see FIG. 4E).

The control unit 160 includes, for example, a CPU and memory and controls the operation (whole) of the exposure apparatus 10. In this embodiment, the control unit 160 especially controls conveyance of the wafer WF by the feed hand 140 and convey hand 150.

In conveying the wafer WF downward in the vertical direction with downward acceleration or in the horizontal direction by the feed hand 140 and convey hand 150, the contact pressures of the wafer WF with the feed hand 140 and convey hand 150 drop due to factors associated with the acceleration at which the wafer WF is conveyed. Therefore, a shift or drop of the wafer WF is more likely to occur during its conveyance by the feed hand 140 and convey hand 150 in that case. In contrast, in conveying the wafer WF upward in the vertical direction with upward acceleration by the feed hand 140 and convey hand 150, the contact pressures of the wafer WF with the feed hand 140 and convey hand 150 rise due to factors associated with the acceleration at which the wafer WF is conveyed. Therefore, a shift or drop of the wafer WF is extremely less likely to occur during its conveyance by the feed hand 140 and convey hand 150 in that case.

For this reason, the control unit 160 controls the conveyance condition so that the conveyance acceleration is lower when the feed hand 140 and convey hand 150 convey the wafer WF downward in the vertical direction with downward acceleration than when they convey the wafer WF upward in the vertical direction with upward acceleration. Similarly, the control unit 160 controls the conveyance condition so that the conveyance acceleration is lower when the feed hand 140 and convey hand 150 convey the wafer WF in the horizontal direction than when they convey the wafer WF upward in the vertical direction with upward acceleration. Moreover, the control unit 160 may control the conveyance condition so that the conveyance acceleration is lower when the feed hand 140 and convey hand 150 convey the wafer WF downward in the vertical direction with downward acceleration than when they convey the wafer WF in the horizontal direction.

Also, a shift or drop of the wafer WF is more likely to occur during its conveyance by the feed hand 140 and convey hand 150 when the wafer WF has a warp than when it has no warp.

Figure 5A:
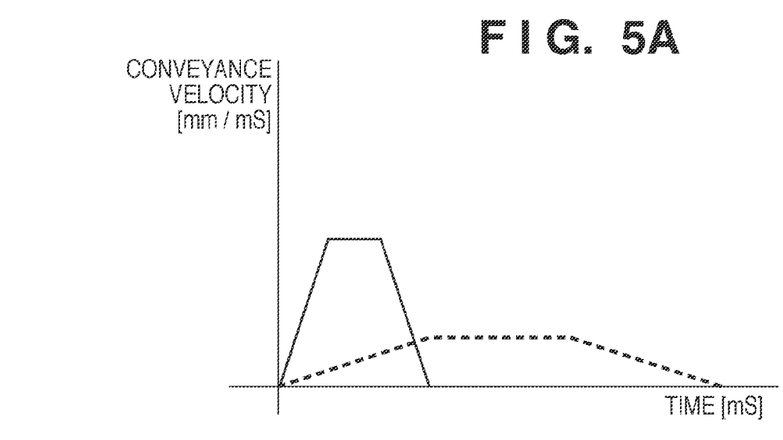
FIGS. 5A to 5D are graphs illustrating one example of the driving conditions of the feed hand and convey hand of the exposure apparatus in the exposure system shown in FIG. 1.
Figure 5B:
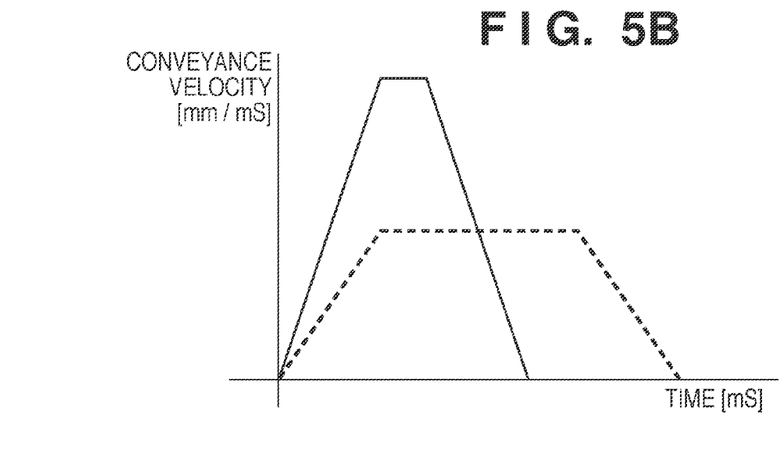
Figure 5C:
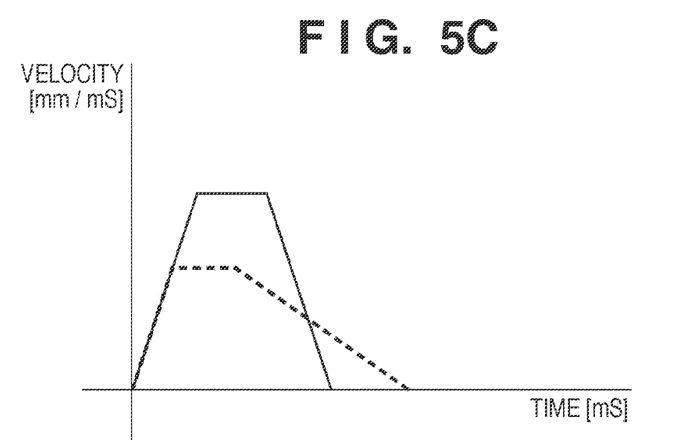
Figure 5D:
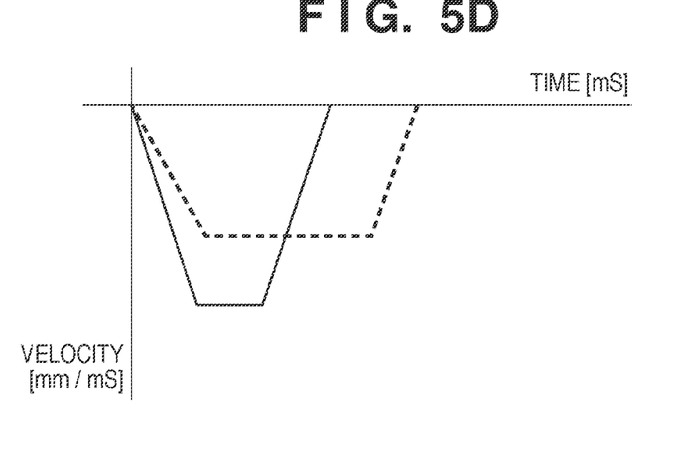

In view of this, the control unit 160 determines, the conveyance acceleration at which the feed hand 140 and convey hand 150 convey the wafer WF, in accordance with the amount of warp of the wafer WF. For example, if the amount of warp of the wafer WF is smaller than a predetermined amount in conveying the wafer WF downward in the vertical direction with downward acceleration, the control unit 160 determines the conveyance acceleration at which the feed hand 140 and convey hand 150 convey the wafer WF such that a conveyance condition as indicated by a solid line in FIG. 5C or FIG. 5D is satisfied. On the other hand, if the amount of warp of the wafer WF is greater than or equal to the predetermined amount in that conveyance operation, the control unit 160 determines the conveyance acceleration at which the feed hand 140 and convey hand 150 convey the wafer WF such that a conveyance condition as indicated by a dotted line in FIG. 5C or FIG. 5D is satisfied. Also, if the amount of warp of the wafer WF is smaller than a predetermined amount in conveying the wafer WF in the horizontal direction, the control unit 160 determines the conveyance acceleration at which the feed hand 140 and convey hand 150 convey the wafer WF such that a conveyance condition as indicated by a solid line in FIG. 5B is satisfied. On the other hand, if the amount of warp of the wafer WF is greater than or equal to the predetermined amount in that conveyance operation, the control unit 160 determines the conveyance acceleration at which the feed hand 140 and convey hand 150 convey the wafer WF such that a conveyance condition as indicated by a dotted line in FIG. 5B is satisfied. Note that in FIGS. 5A and 5B, the ordinate indicates the conveyance velocity of the wafer WF (unit: mm/ms), and the abscissa indicates time (unit: ms).

A case in which, for example, the wafer WF is conveyed in the horizontal direction, as shown in FIG. 3B, in transferring the wafer WF to the wafer chuck 106 by the feed hand 140 will be considered. In this case, if the amount of warp of the wafer WF is smaller than a predetermined amount, the feed hand 140 conveys the wafer WF in accordance with a conveyance condition indicated by a solid line in FIG. 5B. However, if the amount of warp of the wafer WF is greater than or equal to the predetermined amount, the feed hand 140 conveys the wafer WF in accordance with a conveyance condition indicated by a dotted line in FIG. 5B. In addition, a case in which the wafer WF is conveyed downward in the vertical direction, as shown in FIG. 3C, will be considered. In this case, if the amount of warp of the wafer WF is smaller than a predetermined amount, the feed hand 140 conveys the wafer WF in accordance with a conveyance condition indicated by a solid line in FIG. 5D. However, if the amount of warp of the wafer WF is greater than or equal to the predetermined amount, the feed hand 140 conveys the wafer WF in accordance with a conveyance condition indicated by a dotted line in FIG. 5D. Note that in FIGS. 3D and 3E, although the feed hand 140 is driven in the horizontal direction, it need not always conform to a conveyance condition indicated by a solid line or dotted line in FIG. 5B because it does not hold the wafer WF.

A case in which the wafer WF is conveyed in the horizontal direction, as shown in FIGS. 4D and 4E, in receiving the wafer WF from the wafer chuck 106 by the convey hand 150 will be considered. In this case, if the amount of warp of the wafer WF is smaller than a predetermined amount, the convey hand 150 conveys the wafer WF in accordance with a conveyance condition indicated by a solid line in FIG. 5B. However, if the amount of warp of the wafer WF is greater than or equal to the predetermined amount, the convey hand 150 conveys the wafer WF in accordance with a conveyance condition indicated by a dotted line in FIG. 5B. Moreover, a case in which the wafer WF is conveyed upward in the vertical direction, as shown in FIG. 4C, will be considered. In this case, if the amount of warp of the wafer WF is smaller than a predetermined amount, the convey hand 150 conveys the wafer WF in accordance with a conveyance condition indicated by a solid line in FIG. 5C. However, if the amount of warp of the wafer WF is greater than or equal to the predetermined amount, the convey hand 150 conveys the wafer WF in accordance with a conveyance condition indicated by a dotted line in FIG. 5C. Note also that in FIG. 4A, although the convey hand 150 is driven in the horizontal direction, it need not always conform to a conveyance condition indicated by a solid line or dotted line in FIG. 5B because it does not hold the wafer WF.

Figure 6:
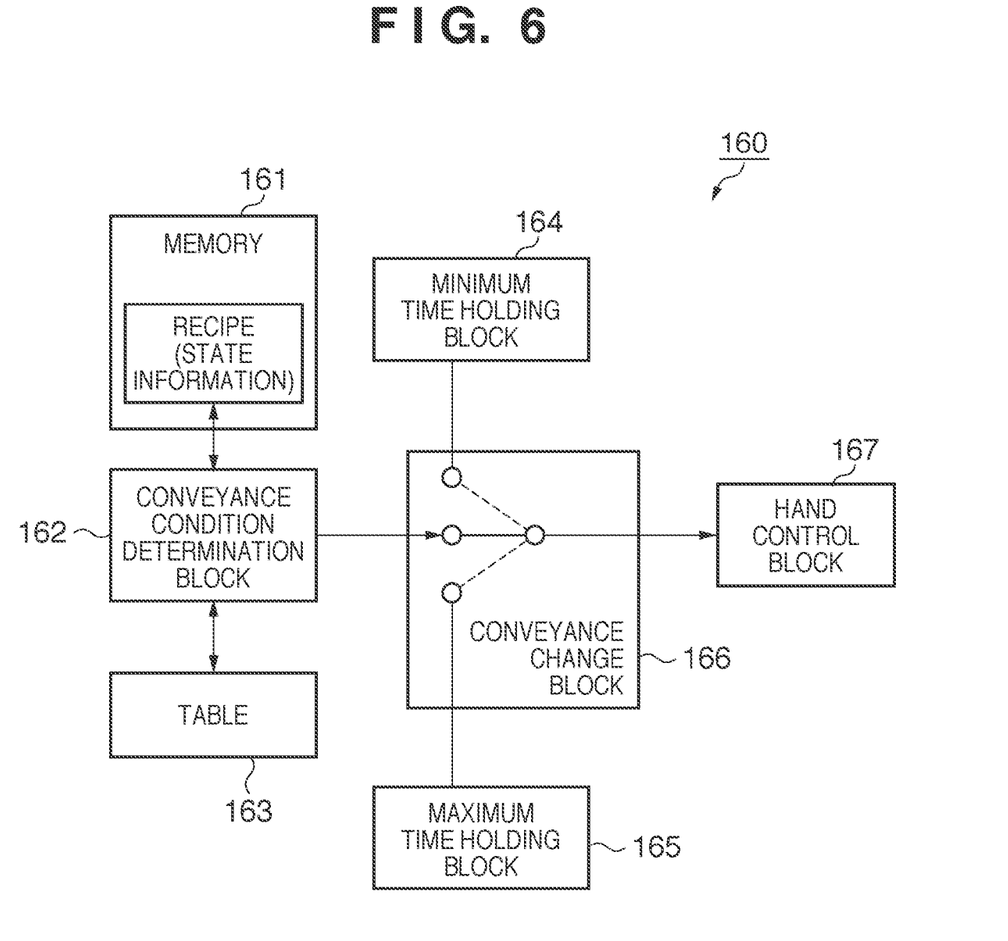
FIG. 6 is a functional block diagram showing a control unit of the exposure apparatus in the exposure system shown in FIG. 1.

FIG. 6 is a functional block diagram showing the control unit 160. Note that FIG. 6 shows blocks associated with control of the conveyance condition of the feed hand 140 and convey hand 150.

A recipe including process parameters associated with, for example, the condition and procedure of an exposure process is input via an input unit of the exposure apparatus 10, and stored in a memory 161 of the control unit 160. The recipe stored in the memory 161 includes state information indicating the state of the lower surface of the wafer WF, including the amount of warp of the wafer WF mentioned above. Although the amount of warp of the wafer WF is defined by, for example, the difference between the lowermost portion and uppermost portion within the wafer plane, the present invention is not limited to this. Also, the state information of the lower surface of the wafer WF includes not only the amount of warp of the wafer WF but also, for example, the direction of warp indicating whether the wafer WF has an upward convex shape or a downward convex shape, information as to whether a foreign substance is adhering on the lower surface of the wafer WF, and the friction coefficient of the lower surface of the wafer WF.

A conveyance condition determination block 162 extracts state information from the recipe stored in the memory 161, and determines the conveyance condition of the feed hand 140 and convey hand 150 by referring to a table 163 to convert the extracted state information into a conveyance condition. Note that the table 163 sets the association between the state information and the conveyance condition. For example, the table 163 sets conveyance velocities corresponding to solid lines in FIGS. 5A and 5B in association with an amount of warp of the wafer WF of less than 100 μm, and sets conveyance velocities corresponding to dotted lines in FIGS. 5A and 5B in association with an amount of warp of the wafer WF of 100 μm or more. However, the conveyance condition includes not only the above-mentioned conveyance velocity but also, for example, the conveyance acceleration at which the feed hand 140 and convey hand 150 convey the wafer WF, the chucking force for chucking the wafer WF, and the conveyance standby time from when the lower surface of the wafer WF starts to be chucked until the wafer WF starts to be conveyed. In this case, the table 163 sets the associations between the state information, and the conveyance time, the acceleration, the chucking force, and the conveyance standby time.

A minimum time holding block 164 holds a conveyance condition to perform an exposure process in a shortest time (that is, a conveyance condition which minimizes the time taken for the wafer WF to be conveyed). A maximum time holding block 165 holds a conveyance condition to perform an exposure process in a longest time (that is, a conveyance condition which maximizes the time taken for the wafer WF to be conveyed).

A conveyance change block 166 inputs the conveyance condition determined by the conveyance condition determination block 162 and that held in the minimum time holding block 164 or minimum time holding block 164 to a hand control block 167 in accordance with conveyance change parameters. In this embodiment, the conveyance change parameters include a "normal mode", "speed mode", and "error avoidance mode", are input via the input unit of the exposure apparatus 10, and are stored in an apparatus database. If the "normal mode" is set for the exposure apparatus 10, the conveyance change block 166 inputs the conveyance condition determined by the conveyance condition determination block 162 to the hand control block 167. If the "speed mode" is set for the exposure apparatus 10, the conveyance change block 166 inputs the conveyance condition held in the minimum time holding block 164 to the hand control block 167. If the "error avoidance mode" is set for the exposure apparatus 10, the conveyance change block 166 inputs the conveyance condition held in the maximum time holding block 165 to the hand control block 167. Hence, setting the "speed mode" or "error avoidance mode" for the exposure apparatus 10 makes it possible to input a preset conveyance condition to the hand control block 167, irrespective of state information indicating the state of the lower surface of the wafer WF.

The hand control block 167 controls, driving of the feed hand 140 and convey hand 150, that is, conveyance of the wafer WF by the feed hand 140 and convey hand 150, based on the conveyance condition input from the conveyance change block 166.

In this manner, the exposure apparatus 10 according to this embodiment can control the conveyance condition in accordance with the direction to convey the wafer WF. This makes it possible to suppress a decrease in throughput while preventing the wafer WF from shifting and dropping during its conveyance. Hence, the exposure apparatus 10 can provide high-quality devices (for example, a semiconductor integrated circuit device and a liquid crystal display device) with a high throughput and good economical efficiency. These devices are fabricated by a step of exposing a substrate (for example, a wafer or a glass plate) coated with a photoresist (photosensitive agent) using the exposure apparatus 10, a step of developing the exposed substrate, and subsequent known steps.

Although this embodiment mainly assumes the conveyance condition as the conveyance velocity, the same control can also be done assuming the conveyance condition as the conveyance standby time, the acceleration, and the chucking force. For example, the conveyance standby time need only be controlled so as to be longer when the feed hand 140 and convey hand 150 convey the wafer WF downward in the vertical direction with downward acceleration or in the horizontal direction than when they convey the wafer WF upward in the vertical direction with upward acceleration. In this way, the wafer WF is conveyed after the chucking force for chucking the lower surface of the wafer WF becomes sufficiently large. This makes it possible to prevent the wafer WF from shifting and dropping during its conveyance, and to increase the acceleration at which the wafer WF is conveyed. Also, the acceleration need only be controlled so as to be lower when the feed hand 140 and convey hand 150 convey the wafer WF downward in the vertical direction with downward acceleration or in the horizontal direction than when they convey the wafer WF upward in the vertical direction with upward acceleration. This makes it possible to prevent the wafer WF from shifting and dropping during its conveyance. The chucking force need only be controlled so as to be larger when the feed hand 140 and convey hand 150 convey the wafer WF downward in the vertical direction with downward acceleration or in the horizontal direction than when they convey the wafer WF upward in the vertical direction with upward acceleration. This makes it possible to prevent the wafer WF from shifting and dropping during its conveyance, to raise the conveyance velocity of the wafer WF, and to increase the acceleration at which the wafer WF is conveyed. Note that the conveyance velocity, the conveyance standby time, the acceleration, and the chucking force can also be controlled in combination with each other as the conveyance condition.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2009-163007, filed on Jul. 9, 2009 and No. 2010-139950 filed on Jun. 18, 2010, which are hereby incorporated by reference herein in their entirety.

What is claimed is:

1. An exposure apparatus for transferring a pattern of a reticle onto a substrate, the apparatus comprising:
   a convey unit configured to convey the substrate while chucking and holding a lower surface of the substrate; and
   a control unit configured to control the convey unit according to a conveyance condition determined based on state information indicating a state of the lower surface of the substrate,
   wherein the control unit controls the convey unit so that a conveyance acceleration is lower when the convey unit conveys the substrate in a vertical direction with a downward acceleration in a first conveyance condition than when the convey unit conveys the substrate in the vertical direction with the downward acceleration in a second conveyance condition, and
   wherein the control unit controls, in the first conveyance condition, the convey unit so that the conveyance acceleration is lower when the convey unit conveys the substrate in the vertical direction with the downward acceleration than when the convey unit conveys the substrate in the vertical direction with an upward acceleration.

2. The apparatus according to claim 1, wherein the control unit controls the convey unit so that the conveyance acceleration is lower when the convey unit conveys the substrate in a horizontal direction than when the convey unit conveys the substrate in the vertical direction with the upward acceleration.

3. The apparatus according to claim 1, wherein:
   the conveyance condition includes a chucking force for chucking the substrate, and
   the control unit determines the conveyance acceleration and the chucking force based on the state information.

4. The apparatus according to claim 3, wherein the control unit has a table indicating associations between the state information, the conveyance acceleration, and the chucking force, and determines the conveyance acceleration and the chucking force by referring to the table.

5. The apparatus according to claim 3, wherein the state information includes at least one of an amount of warp of the substrate, a direction of warp indicating whether the substrate has an upward convex shape or a downward convex shape, information as to whether a foreign substance is adhering on the lower surface of the substrate, or a friction coefficient of the lower surface of the substrate.

6. The apparatus according to claim 1, wherein:
if the convey unit holds the substrate, the control unit controls the convey unit so that the conveyance acceleration is lower when the convey unit conveys the substrate in the vertical direction with the downward acceleration than when the convey unit conveys the substrate in the vertical direction with the upward acceleration, and
if the convey unit does not hold the substrate, the control unit does not control the convey unit so that the conveyance acceleration is lower when the convey unit conveys the substrate in the vertical direction with the downward acceleration than when the convey unit conveys the substrate in the vertical direction with the upward acceleration.

7. The apparatus according to claim 1, wherein:
the control unit controls the convey unit so that the conveyance acceleration is lower when the convey unit conveys the substrate in a vertical downward direction with the downward acceleration in the first conveyance condition than when the convey unit conveys the substrate in the vertical downward direction with the downward acceleration in the second conveyance, and
the control unit controls, in the first conveyance condition, the convey unit so that the conveyance acceleration is lower when the convey unit conveys the substrate in the vertical downward direction with the downward acceleration than when the convey unit conveys the substrate in a vertical upward direction with the upward acceleration.

8. An exposure apparatus for transferring a pattern of a reticle onto a substrate, the apparatus comprising:
a convey unit configured to convey the substrate while chucking and holding a lower surface of the substrate; and
a control unit configured to control the convey unit according to a conveyance condition determined based on state information indicating a state of the lower surface of the substrate,
wherein the control unit controls the convey unit so that a conveyance standby time from when the lower surface of the substrate starts to be chucked until the substrate starts to be conveyed is longer than when the convey unit conveys the substrate in a vertical direction with a downward acceleration in a first conveyance condition than when the convey unit conveys the substrate in the vertical direction with the downward acceleration in a second conveyance condition, and
wherein the control unit controls, in the first conveyance condition, the convey unit so that the conveyance standby time from when the lower surface of the substrate starts to be chucked until the substrate starts to be conveyed is longer when the convey unit conveys the substrate in the vertical direction with the downward acceleration than when the convey unit conveys the substrate in the vertical direction with an upward acceleration.

9. The apparatus according to claim 8, wherein the control unit controls the convey unit so that the conveyance standby time is longer when the convey unit conveys the substrate in a horizontal direction than when the convey unit conveys the substrate in the vertical direction with the upward acceleration.

10. The apparatus according to claim 8, wherein:
the conveyance condition includes the conveyance acceleration at which the substrate is conveyed, and a chucking force for chucking the substrate, and
the control unit determines the conveyance standby time, the conveyance acceleration, and the chucking force based on the state information.

11. The apparatus according to claim 10, wherein the state information includes at least one of an amount of warp of the substrate, a direction of warp indicating whether the substrate has an upward convex shape or a downward convex shape, information as to whether a foreign substance is adhering on the lower surface of the substrate, or a friction coefficient of the lower surface of the substrate.

12. The apparatus according to claim 8, wherein the control unit has a table indicating associations between the state information, the conveyance standby time, the conveyance acceleration, and the chucking force, and determines the conveyance standby time, the conveyance acceleration, and the chucking force by referring to the table.

13. A device fabrication method comprising steps of:
exposing a substrate using an exposure apparatus; and
performing a development process for the substrate exposed,
wherein the exposure apparatus includes:
a convey unit configured to convey the substrate while chucking and holding a lower surface of the substrate; and
a control unit configured to control the convey unit according to a conveyance condition determined based on state information indicating a state of the lower surface of the substrate,
wherein the control unit controls the convey unit so that a conveyance acceleration is lower when the convey unit conveys the substrate in a vertical direction with a downward acceleration in a first conveyance condition than when the convey unit conveys the substrate in the vertical direction with the downward acceleration in a second conveyance condition, and
wherein the control unit controls, in the first conveyance condition, the convey unit so that the conveyance acceleration is lower when the convey unit conveys the substrate in the vertical direction with the downward acceleration than when the convey unit conveys the substrate in the vertical direction with an upward acceleration.

14. A device fabrication method comprising steps of:
exposing a substrate using an exposure apparatus: and
performing a development process for the substrate exposed,
wherein the exposure apparatus includes:
a convey unit configured to convey the substrate while chucking and holding a lower surface of the substrate; and
a control unit configured to control the convey unit according to a conveyance condition determined based on state information indicating a state of the lower surface of the substrate,
wherein the control unit controls the convey unit so that a conveyance standby time from when the lower surface of the substrate starts to be chucked until the substrate starts to be conveyed is longer than when the convey unit conveys the substrate in a vertical direction with a downward acceleration in a first conveyance condition than when the convey unit conveys the substrate in the vertical direction with the downward acceleration in a second conveyance condition, and
wherein the control unit controls, in the first conveyance condition, the convey unit so that the conveyance standby time from when the lower surface of the substrate starts to be chucked until the substrate starts to be conveyed is longer when the convey unit conveys the substrate in the vertical direction with the downward acceleration than when the convey unit conveys the substrate in the vertical direction with an upward acceleration.

15. An exposure apparatus for transferring a pattern of a reticle onto a substrate, the apparatus comprising:
- a convey unit configured to convey the substrate while chucking and holding a lower surface of the substrate; and
- a control unit configured to control the convey unit according to a conveyance condition determined based on state information indicating a state of the lower surface of the substrate,
- wherein the control unit controls the convey unit so that a conveyance acceleration is lower when the convey unit conveys the substrate in a vertical upward direction with a deceleration in a first conveyance condition than when the convey unit conveys the substrate in the vertical upward direction with the deceleration in a second conveyance condition, and
- wherein the control unit controls, in the first conveyance condition, the convey unit so that the conveyance acceleration is lower when the convey unit conveys the substrate in the vertical upward direction with the deceleration than when the convey unit conveys the substrate in the vertical upward direction with the acceleration.

* * * * *